United States Patent
Ohsawa et al.

(10) Patent No.: US 6,351,025 B1
(45) Date of Patent: *Feb. 26, 2002

(54) SEMICONDUCTOR CHIP HAVING AN UNDERPLATE METAL LAYER

(75) Inventors: Kenji Ohsawa; Hidetoshi Kusano, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/702,457

(22) Filed: Oct. 31, 2000

Related U.S. Application Data

(62) Division of application No. 09/084,189, filed on May 26, 1998, now Pat. No. 6,140,153.

(30) Foreign Application Priority Data

May 27, 1997 (JP) .............................................. 9-136776

(51) Int. Cl.$^7$ ............................................ H01L 23/495
(52) U.S. Cl. ....................... 257/673; 257/676; 257/690; 257/713; 361/723; 361/813
(58) Field of Search .................................. 257/666, 673, 257/690, 692, 713, 735, 777, 778, 672, 675, 676; 361/723, 773, 813

(56) References Cited

U.S. PATENT DOCUMENTS

| | | | | |
|---|---|---|---|---|
| 4,967,313 A | * | 10/1990 | Berner | 361/400 |
| 5,221,428 A | * | 6/1993 | Ohsawa et al. | 156/652 |
| 5,359,222 A | * | 10/1994 | Okutomo et al. | 257/659 |
| 5,422,514 A | * | 6/1995 | Friswold et al. | 257/679 |
| 5,437,764 A | * | 8/1995 | Ohsawa et al. | 216/14 |
| 5,474,957 A | * | 12/1995 | Urushima | 438/123 |
| 5,481,798 A | * | 1/1996 | Ohsawa et al. | 29/827 |
| 5,541,447 A | * | 7/1996 | Maejima et al. | 257/669 |
| 5,656,550 A | * | 8/1997 | Tsuji et al. | 438/123 |
| 5,659,198 A | * | 8/1997 | Okutomo et al. | 257/659 |
| 5,756,377 A | * | 5/1998 | Ohsawa | 438/111 |
| 5,843,810 A | * | 12/1998 | Sato et al. | 438/123 |
| 5,886,399 A | * | 3/1999 | Ohsawa et al. | 257/668 |
| 5,945,741 A | * | 8/1999 | Ohsawa et al. | 257/777 |
| 5,982,033 A | * | 11/1999 | Ohsawa et al. | 257/737 |
| 6,020,626 A | * | 2/2000 | Ohsawa et al. | 257/668 |
| 6,051,450 A | * | 4/2000 | Ohsawa et al. | 438/123 |
| 6,117,566 A | * | 9/2000 | Matsumoto et al. | 428/675 |

FOREIGN PATENT DOCUMENTS

| WO | WO 9834278 A | 8/1998 | ........... H01L/23/50 |
|---|---|---|---|
| WO | WO98/34278 | 8/1998 | ........... H01L/23/50 |

* cited by examiner

Primary Examiner—Olik Chaudhuri
Assistant Examiner—Alonzo Chambliss
(74) Attorney, Agent, or Firm—Sonnenschein, Nath & Rosenthal

(57) ABSTRACT

To enable readily forming the etching stop layer of a lead frame with multilayer structure by plating without using a large-scale device, enhance adhesive strength between the etching stop layer and an adjacent metal layer and prevent peeling caused by deterioration caused by the invasion of a chemical between the etching stop layer and each adjacent metal layer from occurring, an etching stop layer is formed by nickel or a nickel alloy in a method of manufacturing a lead frame at least provided with an etching process for selectively etching metal layers using an etching stop layer as an etching stopper in a state in which a thick metal layer is formed on one side of the etching stop layer as an intermediate layer and a thin metal layer is formed on the other side and a process for etching the etching stop layer using the metal layers on both sides as a mask.

2 Claims, 10 Drawing Sheets

US 6,351,025 B1

SEMICONDUCTOR CHIP HAVING AN UNDERPLATE METAL LAYER

RELATED APPLICATION DATA

This application is a divisional of U.S. application Ser. No. 09/084,189 FILED May 26, 1998, now U.S. Pat. No. 6,140,153. The present and foregoing applications claim priority to Japanese application No. P09-136776 filed May 27, 1997. All of the foregoing applications are incorporated herein by reference to the extent permitted by law.

BACKGROUND OF THE INVENTION

1. Field of the Invention

The present invention relates to a lead frame in which a metal layer such as a copper layer different in thickness is formed on both sides of an etching stop layer as an intermediate layer and leads are formed by the thinner metal layer of them, a method of manufacturing the lead frame, a semiconductor device using such a lead frame and a method of manufacturing the semiconductor device.

2. Description of the Related Art

There is technique for installing a semiconductor device using a lead frame provided with an etching stop layer in which a thick metal layer composed of copper for example to be an outside frame or an outside ring for example is formed on one side of the etching stop layer composed of aluminum for example and a thin metal layer composed of copper for example or patterned leads composed of the metal is/are formed on the other side, the metal layers are etched using the etching stop layer as an etching stopper to pattern the thick metal layer and the thin metal layer for forming leads and afterward, the etching stop layer is etched using the above both metal layers as a mask.

FIGS. 10A to 10E and FIGS. 11A to 11C show a method of manufacturing such a lead frame in the order of processes (A) to (H).

(A) Lead frame material 1 with three-layer structure shown in FIG. 10A is prepared. As for the lead frame 1, an aluminum film 3 approximately 3 μm thick for example is formed on the surface of a substrate 2 approximately 150 μm thick for example composed of copper or a copper alloy by vapor deposition or sputtering and further, an underplate layer 4 approximately 0.1 to 2 μm thick for example composed of thin copper or nickel is formed. The lead frame material 1 is finally left as an outside ring.

(B) Next, a resist film is formed on the above underplate layer 4, the resist film is exposed and developed for patterning. The pattern of the resist film is the negative pattern of the pattern of leads to be formed. When the above patterning is finished, a film composed of copper or nickel and others is formed by plating using the resist film as a mask. A reference number 5 denotes a lead formed by plating and FIG. 10B shows a state after the resist film is removed after the lead 5 and others are formed.

(C) Next, as shown in FIG. 10C, a lead frame in which plural film circuits are integrated by selectively etching the lead frame material 1 from both sides so that the selective etching pierces a part of the lead frame material is formed. In the above etching, etchant such as ferric chloride is used.

(D) Next, as shown in FIG. 10D, an insulating layer (an insulating film) 6 is selectively formed on the surface on the lead formed side of the above lead frame material 1. Resin material provided with photosensitivity is used for the insulating layer 6 and a desired pattern is formed by applying, exposing and developing the insulating layer. A reference number 7 denotes an opening for exposing a part in which the ball electrode 8 of each lead 5 of the insulating layer 6 is to be formed and the insulating layer 6 is selectively etched so that the openings 7 are provided.

(E) Next, as shown in FIG. 10E, a solder ball 8 to be an external terminal is formed on the surface of the above lead 5 using the insulating layer 6 as a mask. The solder ball 8 is formed by nickel plate 80 to 110 μm thick for example and solder or gold plate 0.1 to 5 μm thick for example.

(F) Next, as shown in FIG. 11A, the inside from a part 9 to be an outside ring of the thick copper layer 2 located on the rear side of the lead frame material 1 is selectively etched from the rear side. In the above etching, etchant such as $H_2SO_4$ and $H_2O_2$ is used for example. The reason is that the above etchant erodes copper, however, it does not erode aluminum and an aluminum layer 3a can function as an etching stopper. In this process, the aluminum layer 3a is left except a part removed in the selective etching shown in FIG. 10C.

(G) Next, as shown in FIG. 11B, the underplate layer 4 under the leads 5 and the aluminum layer 3a as an etching stopper are etched using the above leads 5 and the left thick copper layer 2 as a mask. Hereby, each lead 5 is separated and is released from a state in which each lead is mutually electrically short-circuited.

(H) Next, if necessary, as shown in FIG. 11C, a bump 10 is formed at the end of each lead 5. Therefore, the bump may be formed on the side of the semiconductor device and no bump may be formed.

FIG. 12 is a sectional view showing a semiconductor device installed using the lead frame manufactured according to the method shown in FIGS. 10 and 11. A reference number 11 denotes a semiconductor device and each electrode of it is connected to the end of the above each lead 5 via the bump 10. A reference number 12 denotes sealing resin for sealing the semiconductor device 11, 13 denotes a thin dish-shaped heat spreader connected to each rear of the lead frame and the semiconductor device 11 and 14 denotes a conductive adhesive composed of silver paste for example for bonding the rear of the semiconductor device 11 to the heat spreader 13.

As for the above lead frame with multilayer structure in which a thick metal layer composed of copper and others is formed on one side of an etching stop layer composed of aluminum as an intermediate layer and a thin metal layer or leads composed of a thin metal layer is/are formed on the other side and a method of manufacturing it, various propositions are made by a company to which the applicants belong, however, there are the following problems in the technique.

First, to form the aluminum layer 3, vapor deposition or sputtering is required to be used, a high-priced device such as a vapor deposition device or a sputtering device is required to be used for vapor deposition or sputtering and there is a problem that such a high-priced device is the cause of the high cost. Second, bonding strength between a metal layer formed by vapor deposition or sputtering and a layer under the metal layer is weak independent of whether the metal layer is composed of aluminum or not and there is a problem that peeling between the aluminum layer and the copper film is readily caused in a process in which the lead frame is manufactured by the invasion of a chemical between the aluminum layer 3 and the copper film 2. The reason is that in case a metal layer is formed by vapor deposition or sputtering, bonding strength between layers depends upon van der Waals force and the force is remarkably weak, compared with adhesive strength in case a metal layer is formed by plating and others.

Particularly, a chemical readily invades between the copper film 2 of the outside ring 9 and the etching stop layer 3 composed of aluminum and peeling is readily caused. A problem that the outside dimension of a package is changed and resin for sealing, adhesion and others is cracked is caused by such delamination.

SUMMARY OF THE INVENTION

The present invention is made to solve the above problems and the object is to enable the formation of an etching stop layer in a lead frame provided with multilayer structure having the etching stop layer as an intermediate layer by plating using a simple device without using a large-scale device, further, to enhance adhesive strength between the etching stop layer and each adjacent metal layer and to prevent deterioration from being caused by the invasion of a chemical between the etching stop layer and the adjacent metal layer and the layers from being peeled.

The lead frame disclosed in claim 1 is characterized in that in the lead frame in which the etching stop layer is provided between the thick outer lead and the thin inner lead, the etching stop layer is formed by nickel or a nickel alloy.

Therefore, according to the lead frame disclosed in claim 1, as the etching stop layer is formed by nickel or a nickel alloy, it can be formed by plating. Therefore, as a high-priced vapor deposition device or sputtering device for vapor deposition or sputtering required in a case that aluminum is used for an etching stop layer is not required, the cost of facilities can be reduced and as a result, the cost of a lead frame or a semiconductor device using it can be reduced.

As the etching stop layer can be formed by plating, bonding strength between the etching stop layer and each adjacent metal layer can be enhanced, compared with a case that the etching stop layer is formed by vapor deposition or sputtering. The reason is that as the formation of the metal layer by plating is executed, growing a crystal grid, remarkably stronger adhesive strength than adhesive strength depending upon van der Waals force can be obtained. Therefore, the occurrence of deterioration caused by the invasion of a chemical between the etching stop layer and each adjacent metal layer and peeling as a result can be prevented.

The lead frame disclosed in claim 2 is characterized in that in the lead frame provided with leads composed of a thin wiring layer and the outside ring or the outside frame composed of a thick metal layer, the leads and the outside ring or the outside frame are connected via the etching stop layer composed of nickel or a nickel alloy as an intermediate layer.

Therefore, according to the lead frame disclosed in claim 2, as the etching stop layer is formed by nickel or a nickel alloy, it can be formed by plating. Therefore, as a high-priced vapor deposition device or sputtering device for vapor deposition or sputtering required in a case that aluminum is used for an etching stop layer is not required, the cost of facilities can be reduced and as a result, the cost of a lead frame or a semiconductor device using it can be reduced.

As the etching stop layer can be formed by plating, bonding strength between the etching stop layer and each adjacent metal layer can be enhanced, compared with a case that the etching stop layer is formed by vapor deposition or sputtering as described above. Therefore, deterioration and peeling caused by the invasion of a chemical between the etching stop layer and each adjacent metal layer can be prevented. Particularly, the change of the outside dimension of a package and the occurrence of a crack on the resin for sealing, bonding and others respectively caused by the invasion of a chemical between the metal layer of the outside ring and the etching stop layer which is caused in a case that the outside ring is provided and peeling as a result can be prevented.

The method of manufacturing the lead frame disclosed in claim 3 is characterized in that in the method of manufacturing the lead frame at least provided with an etching process for selectively etching metal layers using the etching stop layer as a mask in a state in which a thick metal layer is formed on one side of the etching stop layer as an intermediate layer and leads composed of a thin metal layer are formed on the other side and a process for etching the etching stop layer using the metal layers on both sides as a mask, the etching stop layer is formed by nickel or a nickel alloy.

Therefore, according to the method of manufacturing the lead frame disclosed in claim 3, as the etching stop layer is formed by nickel or a nickel alloy, it can be formed by plating. Therefore, as a high-priced vapor deposition device or sputtering device for vapor deposition or sputtering required in a case that aluminum is used for an etching stop layer is not required, the cost of facilities can be reduced and as a result, the cost of a lead frame or a semiconductor device using it can be reduced.

As the etching stop layer can be formed by plating, bonding strength between the etching stop layer and each adjacent metal layer can be enhanced, compared with a case that the etching stop layer is formed by vapor deposition or sputtering as described above. Therefore, deterioration and peeling caused by the invasion of a chemical between the etching stop layer and each adjacent metal layer can be prevented.

The semiconductor device disclosed in claim 4 is characterized in that plural leads are formed on the surface on the side of the semiconductor device of the insulating layer so that the surface of the leads and the surface of the insulating layer are located on the same plane, the end of a part protruded from the insulating layer of each lead functions as a terminal connected to the electrode of the semiconductor device on the side of said semiconductor device, an opening for exposing each lead is formed in a part on the reverse side to the semiconductor device of the insulating layer, an electrode on the reverse side to the semiconductor device of the lead is formed at each opening, the semiconductor device is connected to the electrode via the terminal on the side of the semiconductor device, and the outside ring composed of a thicker metal layer than the lead and provided with a layer composed of nickel or a nickel alloy on the side of the surface for surrounding the semiconductor device is provided on the side of the surface outside a part in which the leads are formed.

Therefore, according to the semiconductor device disclosed in claim 4, as the etching stop layer of the lead frame used for installing the semiconductor device is formed by nickel or a nickel alloy, the semiconductor device can receive the above advantages with which such a lead frame is provided.

The method of manufacturing the lead frame disclosed in claim 5 is characterized in that the lead frame is manufactured according to the manufacturing method disclosed in claim 3 and the semiconductor device is connected to the lead of the lead frame via the electrode of the semiconductor device.

Therefore, according to the method of manufacturing the semiconductor device disclosed in claim 5, as the semiconductor device is manufactured using the lead frame in which the etching stop layer is formed by nickel or a nickel alloy, the above advantages with which such a lead frame is provided can be made the best use of in the method of manufacturing the semiconductor device.

DESCRIPTION OF THE PREFERRED EMBODIMENTS

Figure 1A:
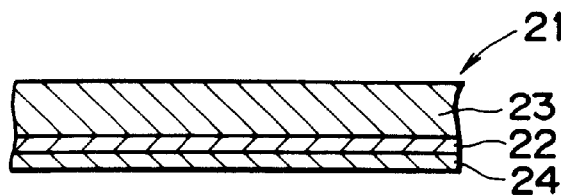
FIGS. 1A and 1E are sectional views showing a first embodiment of a method of manufacturing a lead frame according to the present invention in the order of processes.

A first lead frame according to the present invention is characterized in that an etching stop layer provided between an outer lead and an inner lead composed of a thin wiring layer is formed by nickel or a nickel alloy and a second lead frame is characterized in that an etching stop layer between a lead composed of a thin metal layer and an outside frame or an outside ring composed of thick metal is formed by nickel or a nickel alloy.

The thick metal layer constituting the outer lead and the outside ring or the outside frame is composed of copper or a copper alloy for example and formed so that the thick metal layer is 50 to 200 μm thick for example. The inner lead or a metal layer constituting leads is composed of copper or a copper alloy for example. The metal layer may be also directly formed on the etching stop layer composed of nickel or a nickel alloy, however, to enhance adhesion between the metal layer and the etching stop layer, thin copper 0.1 to 2.0 μm thick for example is plated on the etching stop layer and the metal layer may be also formed on the copper underplate layer.

The etching stop layer may be also formed by nickel, may be also formed by the other material such as a nickel alloy including phosphorous P for example and it is suitable that the thickness is set to approximately 0.1 to 5 μm.

A method of manufacturing the lead frame according to the present invention is characterized in that in the method of manufacturing the lead frame at least provided with an etching process for selectively etching metal layers using the etching stop layer as an etching stopper in a state in which a thick metal layer is formed on one side of the etching stop layer as an intermediate layer and a thin metal layer is formed on the other side and a process for etching the etching stop layer using the metal layers on both sides as a mask, the etching stop layer is formed by nickel or a nickel alloy. In the etching process for selectively etching the metal layers using the etching stop layer as an etching stopper, etchant the etching speed to nickel or a nickel alloy of which is slow and the etching speed to the metal layers formed on both sides of which is remarkably fast is naturally used. Any etchant may be also used if it is provided with such a property, however, if the metal layer is composed of copper or a copper alloy, for example, the mixed solution of aqueous ammonia the chemical formula of which is $NH_4OH$ $NH_3$ and the concentration of which is 15% or more for example and cupric chloride the chemical formula of which is $CuCl_2$ and the density of which is 20% or more for example is suitable.

In the etching process for selectively etching the etching stop layer using the metal layers as an etching stopper, etchant the etching speed to the metal layers of which is slow and the etching speed to the etching stop layer composed of nickel or a nickel alloy as an intermediate layer of which is remarkably fast is naturally used. Any etchant may be also used if it is provided with such a property, however, if the metal layers are composed of copper or a copper alloy, process acidic liquid mainly composed of sulfuric acid of approximately 25% and hydrogen peroxide of approximately 6% for example is suitable.

Referring to the drawings, embodiments of the present invention will be described in detail below.

Figure 1B:
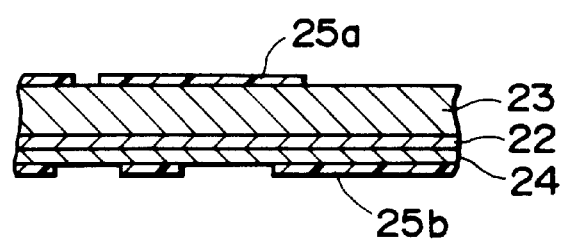
Figure 1C:
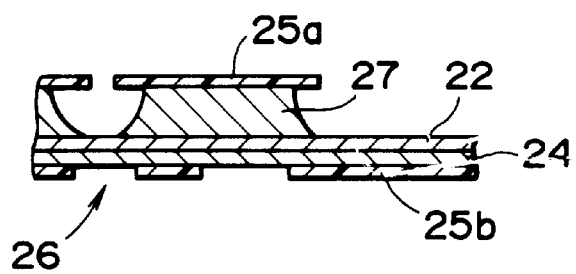
Figure 1D:
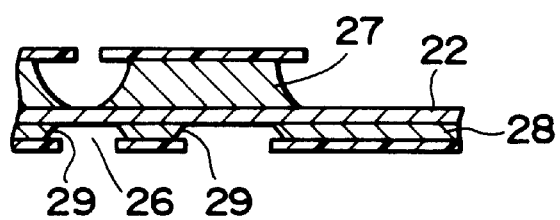
Figure 1E:
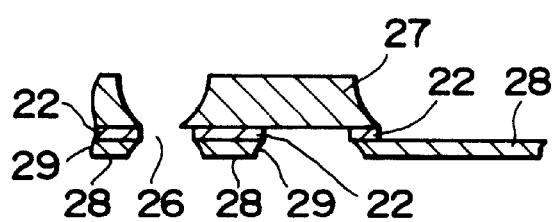
Figure 2A:
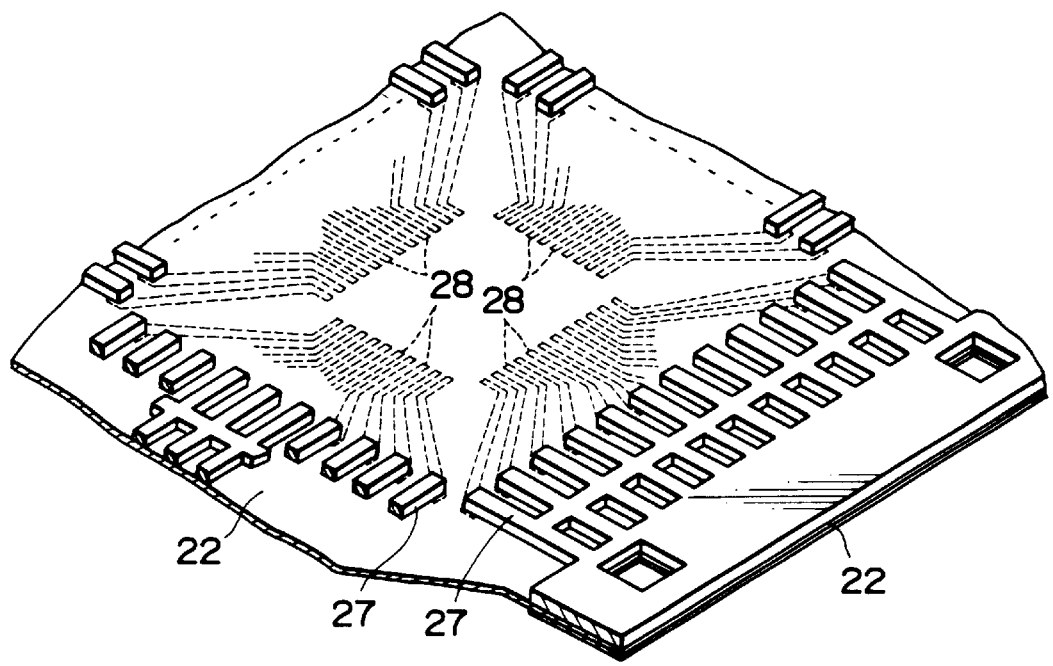
FIGS. 2A and 2B are perspective drawings showing the above embodiment in the order of processes.
Figure 2B:
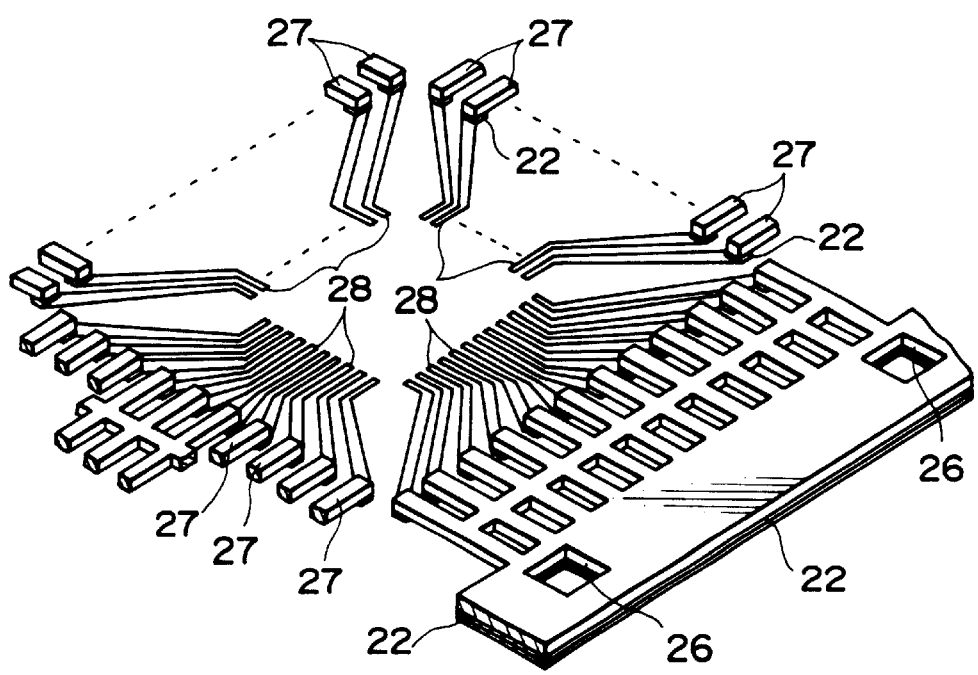

FIGS. 1A to 1E are sectional views showing a first embodiment of a method of manufacturing a lead frame according to the present invention in the order of processes and FIGS. 2A and 2B are perspective drawings showing the embodiment in the order of processes.

(A) As shown in FIG. 1A, a metal plate in which three layers are laminated is prepared as lead frame material 21. The lead frame material 21 is provided with three-layer structure in which an etching stop layer 22 with the thickness of 2 to 30 μm is held between a thick metal layer 23 composed of a 42% alloy or a copper base alloy with the thickness of approximately 100 to 250 μm for example and a thin metal layer 24 composed of copper foil with the thickness of approximately 10 to 50 μm. The thick metal layer 23 to be outer leads is provided to secure mechanical strength, while the thin metal layer 24 to be inner leads is formed thin so that a minute pattern can be formed.

The etching stop layer 22 is composed of nickel or a nickel alloy. As nickel or a nickel alloy is metal which is not etched by etchant for the metal layers 23 and 24, for example the mixed solution of aqueous ammonia the chemical formula of which is $NH_4OH$ $NH_3$ and the concentration of which is 15% or more for example and cupric chloride the chemical formula of which is $CuC_2$ and the density of which is 20% or more for example, the above metal is selected for the material of the etching stop layer 22, and the etching stop layer 22 plays a part of preventing one of the metal layers 23 and 24 from being etched by etching for the other later.

(B) Next, as shown in FIG. 1B, photo resist films 25a and 25b are respectively selectively formed on each surface of the metal layers 23 and 24. The photo resist film 25a formed on the surface of the thick metal layer 23 is provided with a pattern constituting a part except the inner lead of the lead frame and the photo resist film 25b formed on the surface of the thin metal layer 24 is provided with a pattern constituting a part to be particularly thick such as the inner lead and the vicinity of a guide hole 26. The width of an opening of the photo resist film 25 is normally set to 10 to 20 μm at the minimum, however, the width of an opening in a part to be thick such as the vicinity of the guide hole 26 is required to be set in consideration of the quantity of side etching.

(C) Next, the surface of the thick metal layer 23 of the lead frame material 1 is etched using for example the mixed solution of aqueous ammonia the chemical formula of which is $NH_4OH$ $NH_3$ and the concentration of which is 15% or more for example and cupric chloride the chemical formula of which is $CuCl_2$ and the density of which is 20% or more for example. Then, as shown in FIG. 1C, the metal layer 23 is selectively etched and an outer lead 27 which is the body of the lead frame is formed.

(D) Next, the thin metal layer 24 is etched using the above etchant or sulfate to which fluoride salt and a surface active agent are added. Then, as shown in FIG. 1D, the metal layer 24 is selectively etched and a thick part 29 in which the inner lead 28 and the guide hole 6 are formed is formed. If the metal layer 24 is copper foil 18 μm thick, inner leads 28 can be actually formed at the pitch of approximately 40 μm which means remarkable fining and a request for increasing the number of pins can be met.

Afterward, the photo resist films 25a and 25b are removed by a solvent. FIG. 2A is a perspective drawing showing the state after the photo resist films 25a and 25b are removed.

(E) Next, the etching stop layer 22 is removed by etchant which is acid solution mainly composed of sulfuric acid of approximately 25% and hydrogen peroxide of approximately 6% for example. The etching speed of the etchant is slow to copper and is fast to nickel or a nickel alloy. As shown in FIG. 1E, after the etching, the etching stop layer 22 is left only in the part left after etching of the metal layer 23 and the metal layer 24, the etching stop layer 22 except that in the above part is removed and a lead frame is completed. FIG. 2B shows a state after the lead frame is completed.

If necessary, tin, gold, solder composed of lead of 10% and tin of 90% and others may be also plated overall or partly on the surface of the lead frame.

In the above example, the peeling of the photo resist films 25a and 25b and the removal of the etching stop layer 22 respectively after selective etching is finished are separately done, however, they may be also simultaneously done. If an ultrasonic wave is applied when the resists are removed, the resists can be readily removed.

According to this method of manufacturing a lead frame, the metal layer 23 of the lead frame material 21 can be formed so that the layer is thick enough to secure sufficient mechanical strength as the base metal (outer lead) of the lead frame and the metal layer 24 can be formed so that the layer is thin enough to form minute inner leads 28 by etching.

The reason is that as the etching stop layer 22 is held between the metal layers 23 and 24, the metal layers 23 and 24 can be independently etched.

Therefore, a lead frame provided with sufficient mechanical strength in which inner leads are minute can be obtained. Independent etching means not etching in separate processes but the etching of the metal layer 23 without having an effect upon the metal layer 24 or reverse etching. The etching of the metal layer 23 and the etching of the metal layer 24 can be also simultaneously executed.

Further, as the etching stop layer 22 is formed by nickel or a nickel alloy according to this embodiment, the etching stop layer 22 can be formed by plating. Therefore, as a high-priced vapor deposition device or sputtering device for vapor deposition or sputtering required in a case that aluminum is used for the etching stop layer 22 is not required, the cost of facilities can be reduced and as a result, the cost of a lead frame or a semiconductor device using it can be reduced.

As the etching stop layer 22 can be formed by plating, the adhesive strength of the etching stop layer 22 to each adjacent metal layer 27 and 28 can be enhanced, compared with a case that the etching stop layer is formed by vapor deposition or sputtering. The reason is that as the formation of a metal layer by plating is executed, growing a crystal lattice, stronger adhesive strength than adhesive strength by van der Waals force is remarkably obtained. Therefore, deterioration and peeling caused by the invasion of a chemical between the etching stop layer 22 and each adjacent metal layer 27 and 28 can be prevented.

Figure 3:
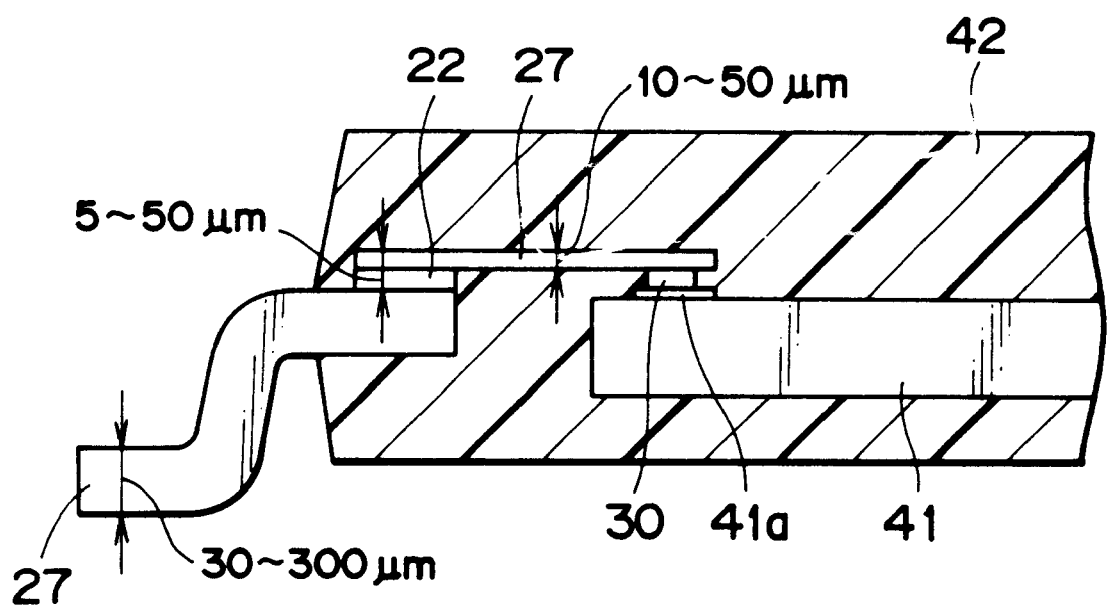
FIG. 3 is a sectional view showing the main part of a semiconductor device using a lead frame in a transformed example of the above method of manufacturing the lead frame.

FIG. 3 shows a semiconductor device using a lead frame in which a bump 30 composed of an etching stop layer 22 is formed at the end of an inner lead 28 by varying a part of the method shown in FIGS. 1. The lead frame can be formed by masking a part in which the bump 30 of the etching stop layer 22 is to be formed with a photo resist film again after metal layers 23 and 24 of lead frame material 21 are selectively etched and photo resist films 25a and 25b are removed according to the method of manufacturing the lead frame shown in FIGS. 1 and by etching the etching stop layer 22 afterward. Needless to say, the above method is not different from the embodiment shown in FIGS. 1 as to the use of etchant. A reference number 41 in FIG. 3 denotes a semiconductor device, 41a denotes an electrode pad and 42 denotes resin.

FIGS. 4A to 4E and FIGS. 5A to 5C are sectional views showing a second embodiment of the method of manufacturing the lead frame according to the present invention in the order of processes (A) to (H).

Figure 4A:
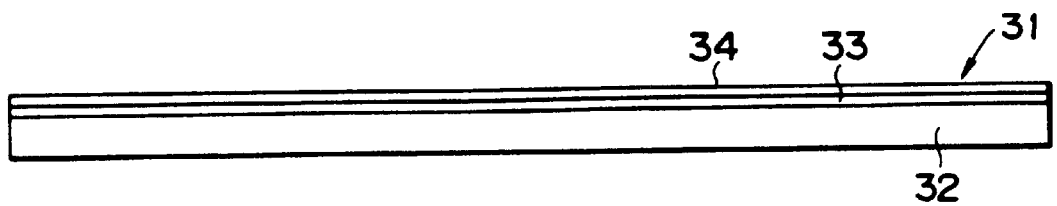
FIGS. 4A to 4E are sectional views showing processes (A) to (E) of processes (A) to (H) in order in a second embodiment of the method of manufacturing the lead frame according to the present invention.

(A) Lead frame material 31 with three-layer structure shown in FIG. 4A is prepared. The lead frame material 31 is formed by forming a nickel film 33 to be an etching stop layer approximately 3 μm thick for example by plating on the surface of a substrate 32 approximately 50 to 200 μm thick for example composed of copper or a copper alloy and further by forming an underplate layer 34 approximately 0.1 to 2 μm thick for example composed of thin copper or nickel. The lead frame material 31 is an outside ring in a final process. The underplate layer 34 is formed to enhance the adhesiveness of leads described later and is not necessarily inevitable.

Figure 4B:
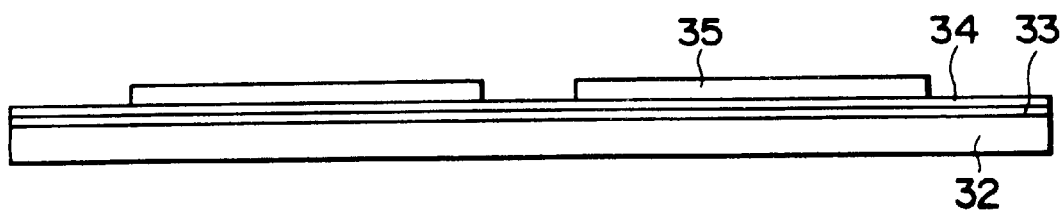

(B) Next, a resist film is formed on the above underplate layer 34 and is patterned by exposure and developing. The pattern of the resist film is negative to the pattern of leads to be formed. When above patterning is finished, a film composed of copper is plated using the resist film as a mask. A reference number 35 denotes a lead formed by plating and FIG. 4B shows a state after the resist film is removed after the lead 35 and others are formed. A laminate of metal films to be a lead may be also used for lead frame material and a lead may be also formed by etching the metal films.

Figure 4C:
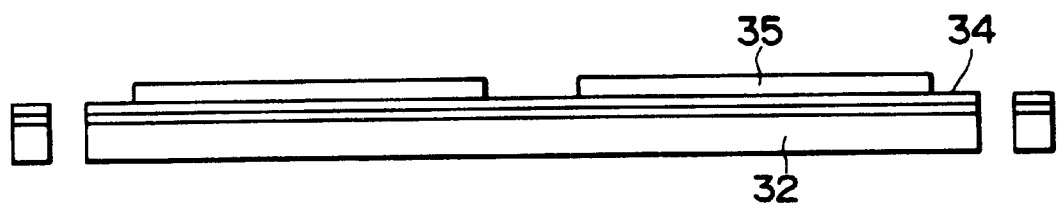

(C) Next, as shown in FIG. 4C, a lead frame in which plural film circuits are integrated by selectively etching the lead frame material 31 from both sides so that the selective etching pierces a predetermined part of the lead frame material is formed. In etching, for example, the mixed solution of aqueous ammonia the chemical formula of which is $NH_4 OH$ $NH_3$ and the concentration of which is 15% or more for example and cupric chloride the chemical formula of which is $CuCl2$ and the density of which is 20% or more for example is used for etchant.

Figure 4D:
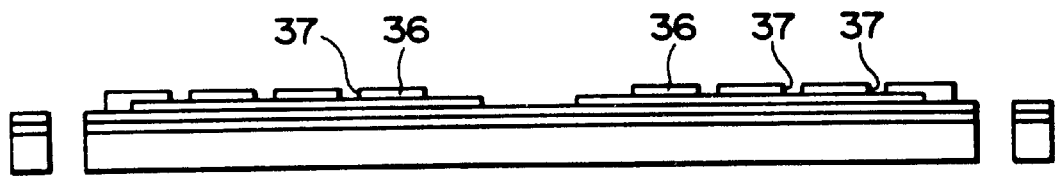

(D) Next, as shown in FIG. 4D, an insulating layer (an insulating film) 36 is selectively formed on the surface of both sides to form a lead of the above lead frame material 31. A desired pattern is formed by applying the insulating layer 36 using resin material provided with photosensitivity, exposing and developing it. Reference numbers 37 denote an opening of the insulating layer 36 for exposing a part in which a ball electrode 38 of each lead 35 is to be formed and the insulating layer 36 is selectively etched to provide the openings 37.

Figure 4E:
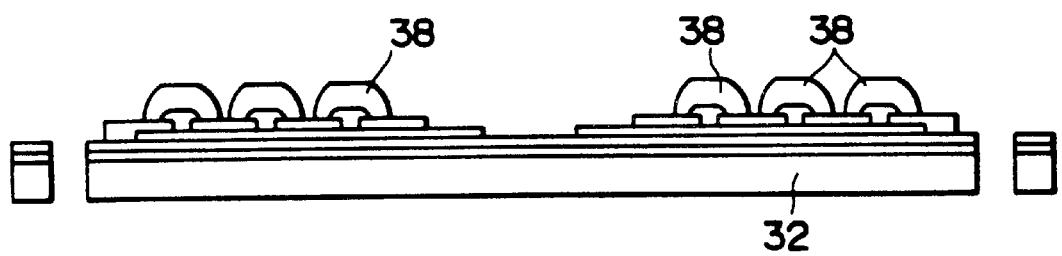

(E) Next, as shown in FIG. 4E, solder balls 38 to be external terminals are formed on the surface of the above each lead 35 using the above insulating layer 36 as a mask. The solder balls 38 are formed by nickel plate 80 to 110 μm thick for example and solder or gold plate 0.1 to 5 μm thick for example or palladium.

Figure 5A:
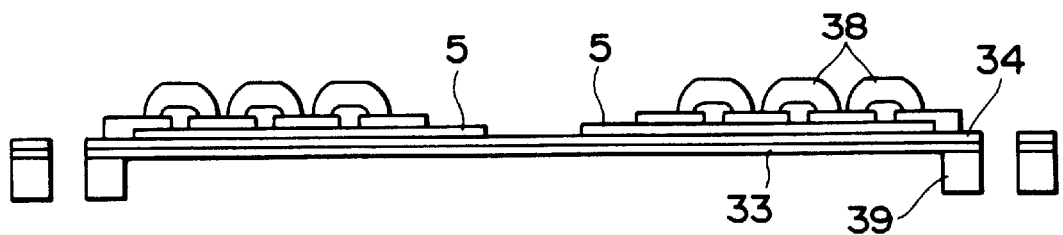
FIGS. 5A to 5C are sectional views showing processes (F) to (H) of the processes (A) to (H) in order in the second embodiment of the method of manufacturing the lead frame according to the present invention.

(F) Next, as shown in FIG. 5A, a part inside a part 39 to be an outside ring of the thick copper layer 32 located on the rear side of the lead frame material 31 is removed by selectively etching from the rear side. In the above etching, the mixed solution of aqueous ammonia the chemical formula of which is $NH_4OH$ $NH_3$ and the concentration of which is 15% or more for example and cupric chloride the chemical formula of which is $CuCl_2$ and the density of which is 20% or more for example is used for etchant. The reason is that the above etchant erodes copper, however, it does not erode nickel and nickel or a nickel alloy 33 can function as an etching stopper. In this process, nickel or a nickel alloy 33 is left except the part removed in the selective etching shown in FIG. 4C.

Figure 5B:
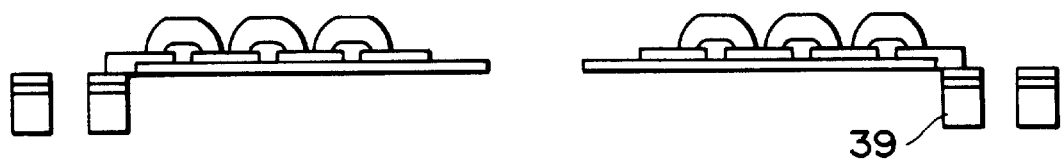

(G) Next, as shown in FIG. 5B, the underplate layer 34 under the leads 35 and the etching stop layer 33 which is an etching stopper are etched using the leads 35 and the left thick copper layer 32 as a mask. In the above etching, mixed solution mainly composed of sulfuric acid and hydrogen peroxide for example is used. Hereby, each lead 35 is separated and is released from a state in which each lead is mutually electrically short-circuited.

Figure 5C:
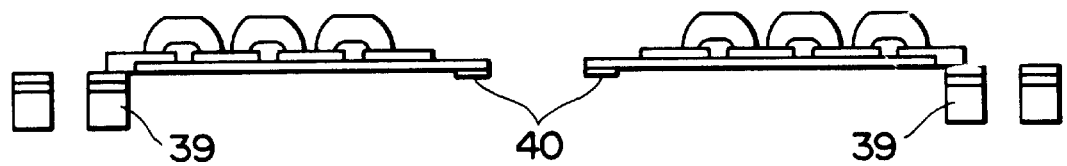

(H) Next, if necessary, as shown in FIG. 5C, a bump 40 is formed at the end of each lead 35. Therefore, a bump may be formed on the side of a semiconductor device 41 and no bump may be formed.

Figure 6:
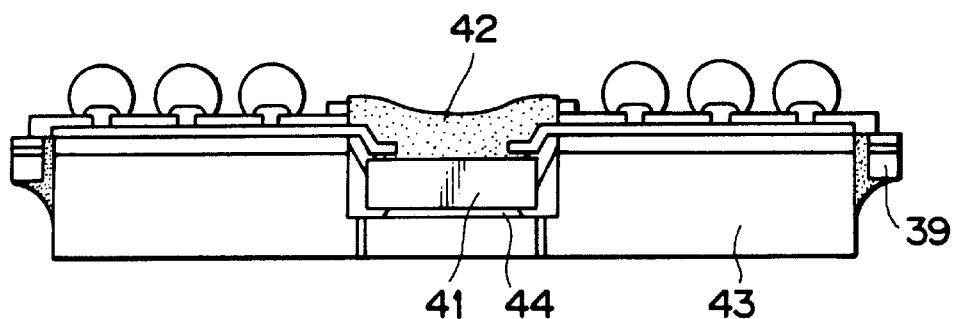
FIG. 6 is a sectional view showing a semiconductor device installed using the lead frame in the second embodiment.

FIG. 6 is a sectional view showing a semiconductor device installed in the lead frame manufactured according to the method shown in FIGS. 4 and 5. A reference number 41 denotes a semiconductor device each electrode of which is connected to the end of the above each lead 35 via the bump 40. A reference number 42 denotes resin for sealing the semiconductor device 41, 43 denotes a thin dish-shaped heat spreader connected to each rear of the lead frame and the semiconductor device 41 and 44 denotes a conductive adhesive composed of silver paste for example for bonding the rear of the semiconductor device 41 to the heat spreader 43.

According to such a method of manufacturing the lead frame, as the etching stop layer 33 is formed by nickel or a nickel alloy, it can be formed by plating. Therefore, a high-priced vapor deposition device or a sputtering device required in a case that aluminum is used for the etching stop layer is not required. The cost of facilities can be reduced and as a result, the cost of a lead frame or a semiconductor device using it can be reduced.

As the etching stop layer 33 can be formed by plating, adhesive strength between the etching stop layer 33 and each adjacent metal layer 32 and 34 can be enhanced, compared with a case that the etching stop layer 33 is formed by vapor deposition or sputtering. Therefore, deterioration and peeling caused by the invasion of a chemical between the etching stop layer 3 and each adjacent metal layer can be prevented. Particularly, the change of the outside dimension of a package and the occurrence of a crack on the resin 42 for sealing, bonding and others respectively caused by the invasion of a chemical between the metal layer of the outside ring 39 and the etching stop layer 33 which is caused in a case that the outside ring 39 is provided and peeling as a result can be prevented.

FIGS. 7A to 7H are sectional views showing a third embodiment of the method of manufacturing the lead frame according to the present invention in the order of processes.

Figure 7A:
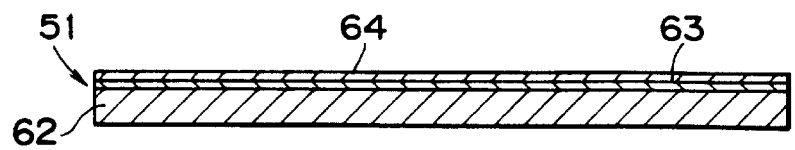
FIGS. 7A to 7H are sectional views showing a third embodiment of the method of manufacturing the lead frame according to the present invention in the order of processes.

(A) First, as shown in FIG. 7A, lead frame material 51 composed of a metal laminated plate with three-layer structure is prepared. The lead frame material 51 is formed by laminating a copper layer 150 μm thick for example to be an outside ring for surrounding a semiconductor device and reinforcing it by adhesion to it, a nickel layer 63 with the thickness of 3 μm for example which functions as an etching stopper and is formed by plating and an underplate layer 64 composed of copper or nickel 2 μm thick for example. The underplate layer 64 may be also provided with multilayer structure such as a nickel layer 2 μm thick for example on a chromium layer 0.2 μm thick for example.

Figure 7B:
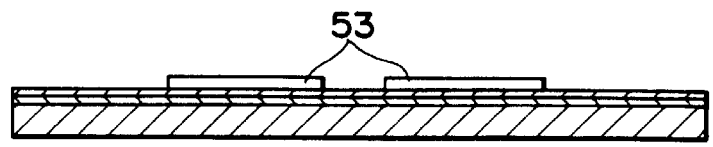

(B) Next, as shown in FIG. 7B, leads 53 and suspending parts 60 (The suspending parts 60 are not shown in FIGS. 7. See FIG. 9.) are formed on the above underplate layer 64. Concretely, the leads and the suspending parts 60 are formed by applying resist according to the negative pattern of a pattern according to which the leads 53 and the suspending parts 60 are to be formed and plating copper or nickel so that it is 30 μm thick for example using the resist as a mask and using the layer 64 as underplate.

The suspending parts 60 are provided in the same layer as the leads 53 to suspend the outside ring 58 for reinforcement for surrounding the semiconductor device 41 and therefore, are composed of copper or nickel for example. In the meantime, the ring 58 is integrated outside the main part of the lead frame via the suspending parts 60 though the ring is not formed yet in this process and is provided with structure in which copper, aluminum, nickel and others are laminated.

Figure 7C:
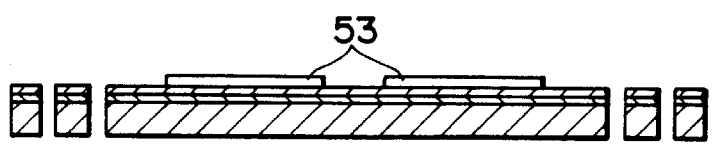

(C) Next, as shown in FIG. 7C, a lead frame in which plural film circuits are integrated by selectively etching the metal laminate 51 from both sides so that selective etching pierces a predetermined part of the metal laminate is formed. In the above etching, for example etchant including ferric chloride composed of the mixed solution of aqueous ammonia the chemical formula of which is $NH_4OH$ $NH_3$ and the concentration of which is 15% or more for example and cupric chloride the chemical formula of which is $CuCl2$ and the density of which is 20% or more for example is used.

Figure 7D:
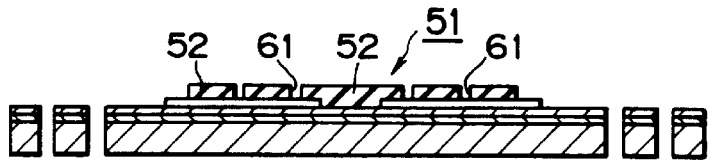

(D) Next, as shown in FIG. 7D, an insulating layer (an insulating film) 52 is selectively formed on the surface on the side on which leads are formed of the above laminate 51. Resin material provided with photosensitivity is used for the insulating layer 52 and a desired pattern is formed by applying, exposing and developing it. Reference numbers 61 and 62 denote an opening of the insulating layer 52 for exposing a part in which ball electrode 56 of each lead 53 is to be formed and the insulating layer 52 is selectively etched so that the opening 61 is provided.

Figure 7E:
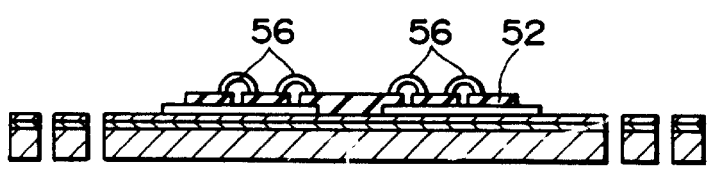

(E) Next, as shown in FIG. 7E, solder balls 56 to be external terminals are formed on the surface of each lead 53 using the insulating layer 52 as a mask. The solder balls 56 are formed by nickel plate 80 to 110 $\mu$m thick for example and solder or gold plate 0.1 to 5 $\mu$m thick for example or palladium.

Figure 7F:
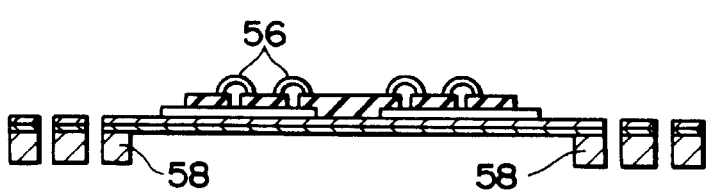

(F) Next, as shown in FIG. 7F, a part inside a part 58 to be an outside ring of the thick copper layer 62 located on the rear side of the laminate 51 is removed by selectively etching from the rear side. In the above etching, etchant including ferric chloride composed of the mixed solution of aqueous ammonia the chemical formula of which is $NH_4OH$ $NH_3$ and the concentration of which is 15% or more for example and cupric chloride the chemical formula of which is $CuCl_2$ and the density of which is 20% or more for example is used. The reason is that the above etchant erodes copper, however, it does not erode nickel and a nickel layer 63 can function as an etching stopper.

In this process, the nickel layer 63 is left except the part removed in the selective etching shown in FIG. 7C.

Figure 7G:
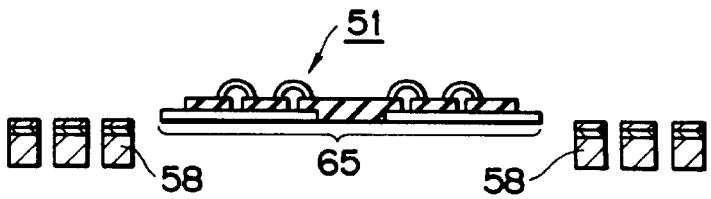

(G) Next, as shown in FIG. 7G, the underplate layer 64 under the leads 53 and the etching stop layer 63 which is an etching stopper and composed of nickel or a nickel alloy are etched using the leads 53 and the suspending parts 60 (The suspending parts 60 are not shown in FIGS. 7. See FIG. 9.) as a mask. In the above etching, the mixed solution of sulfuric acid and the solution of hydrogen peroxide for example is used. Hereby, each lead 53 and each suspending part 60 are separated and are released from a state in which they are mutually electrically short-circuited. A reference number 65 denotes the main part of the lead frame 51 and the main part 65 seems as if it were separated from the outside ring 58 in FIG. 7G, however, it is because the suspending parts 60 are not shown in the sectional view of FIG. 7G and actually, the main part is integrated with the outside ring 58 via the suspending parts 60.

Figure 7H:
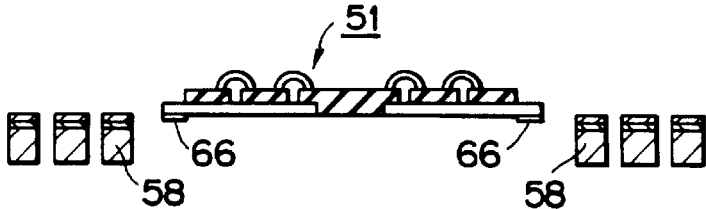

(H) Next, if necessary, as shown in FIG. 7H, a bump 66 is formed at the end 53a of each lead 53. Therefore, a bump may be formed on the side of a semiconductor device 54 and no bump may be formed.

In this embodiment, the lead 53 is formed by growing a plate film using a resist film selectively formed on a underplate film as a mask, however, the lead may be also formed by forming a layer 64 composed of copper or nickel so that it is thick and patterning it by selective etching.

According to this embodiment, the lead frame 51 can be manufactured by utilizing a lead frame manufacturing method in which outer leads are formed on one side of a metal laminate provided with three-layer structure and inner leads are formed on the other side as the method is and as the base of the metal laminate 61 is composed of metal and rigidity is strong, minute leads 53 can be formed precisely and with high positioning precision.

As the etching stop layer 63 is formed by nickel or a nickel alloy, the etching stop layer 63 can be formed by plating. Therefore, a high-priced vapor deposition device or sputtering device for vapor deposition or sputtering required in a case that aluminum is used for the etching stop layer is not required. Therefore, the cost of facilities can be reduced and as a result, the cost of a lead frame or a semiconductor device using it can be reduced.

As the etching stop layer can be formed by plating, the adhesive strength of the etching stop layer 63 to the metal layer (outside ring) 58 can be enhanced, compared with a case that the etching stop layer is formed by vapor deposition or sputtering. Therefore, deterioration and peeling by the invasion of a chemical between the etching stop layer and the adjacent metal layer can be prevented.

FIGS. 8A to 8D show the assembly of the lead frame 51 the processes shown in FIGS. 7 of which are finished and the semiconductor device 41 in the order of processes.

Figure 8A:
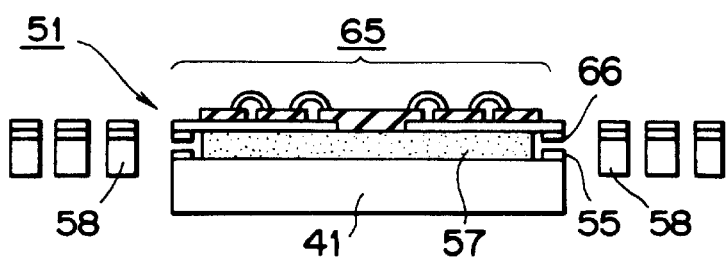
FIGS. 8A to 8D show the assembly of the lead frame in the third embodiment and a semiconductor device in the order of processes.

(A) First, as shown in FIG. 8A, the semiconductor device 41 aligned in the lead frame 51 is positioned and bonded via a buffer adhesive layer 57. As a buffer adhesive 57 bonds the lead frame 51 and the semiconductor device 41 and further, protects the surface of the semiconductor device 41, a property of cushioning is required.

Figure 8B:
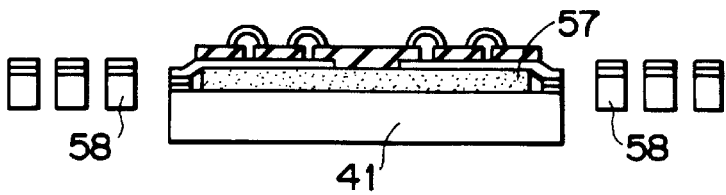

(B) Next, as shown in FIG. 8B, the bump 66 at the end 3a of each lead 53 is connected to the electrode pad 55 of the semiconductor device 41 by single point bonding for example.

In this case, as the end of a part protruded from the insulating layer 52 of the lead 53 functions as a terminal on the side of the semiconductor device, the terminal is not required to be cut for bonding. In this point, the lead frame according to this present invention also differs from the conventional type. Therefore, time required for bonding can be reduced.

Figure 8C:
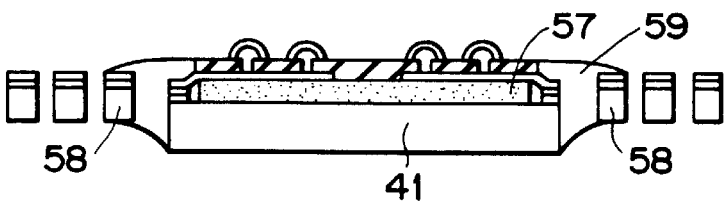

(C) Next, as shown in FIG. 8C, sealant 59 such as epoxy resin and silicon resin is injected between the semiconductor device 41 and the lead frame 51 and between them and the outside ring 58 by potting, seals and fixes between the semiconductor device 54 and the lead frame 51 and between them and the outside ring 58.

Figure 8D:
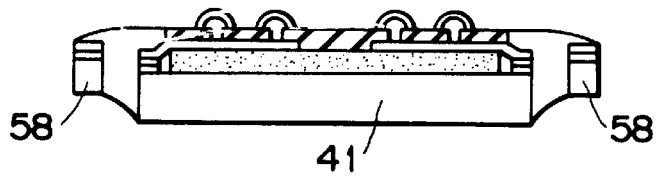
Figure 9:
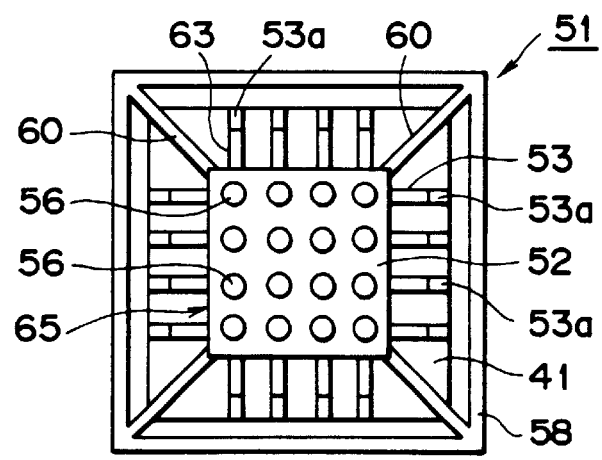
FIG. 9 is a plan showing the semiconductor device installed using the lead frame in the third embodiment in a state in which sealant is removed.
Figure 10A:
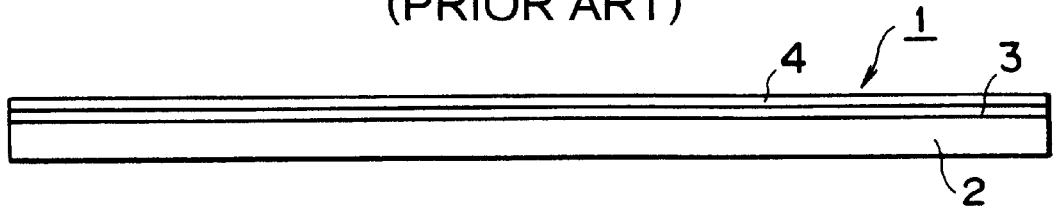
FIGS. 10A to 10E are sectional views showing processes (A) to (E) of processes (A) to (H) in a conventional type method of manufacturing a lead frame in order.
Figure 10B:
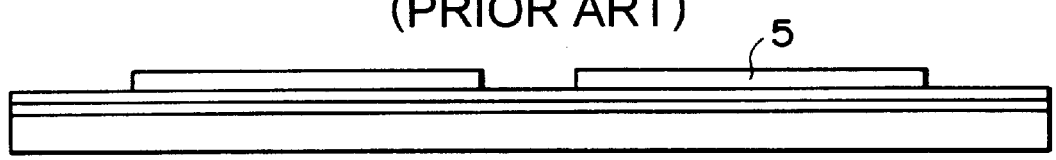
Figure 10C:
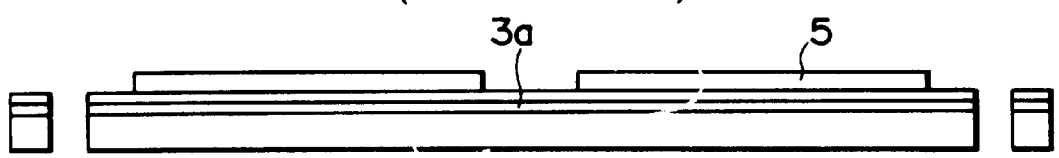
Figure 10D:
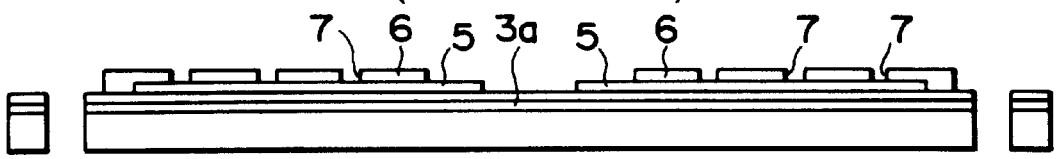
Figure 10E:
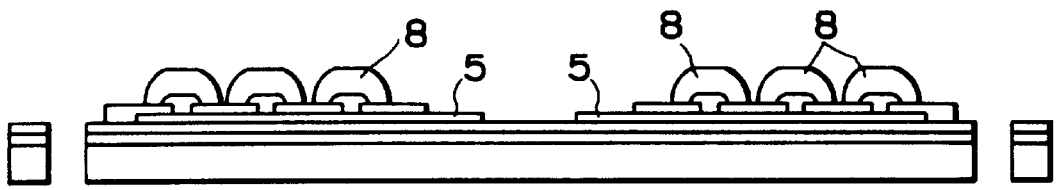
Figure 11A:
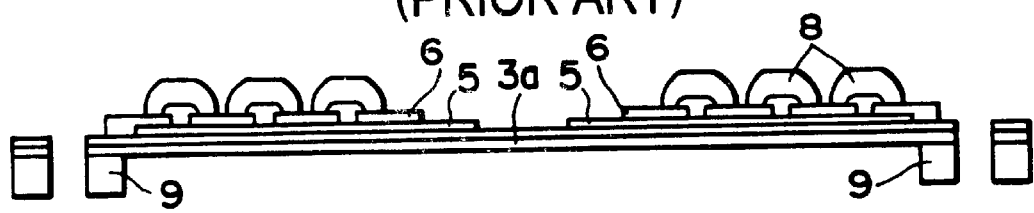
FIGS. 11A to 11C are sectional views showing processes (F) to (H) of the processes (A) to (H) in the above conventional type in order.
Figure 11B:
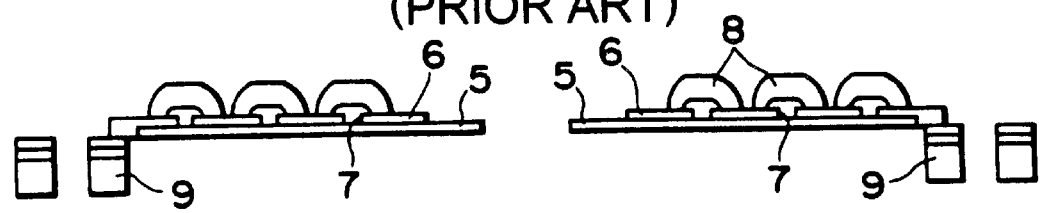
Figure 11C:
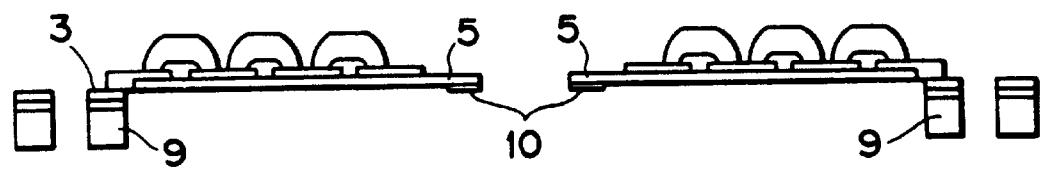
Figure 12:
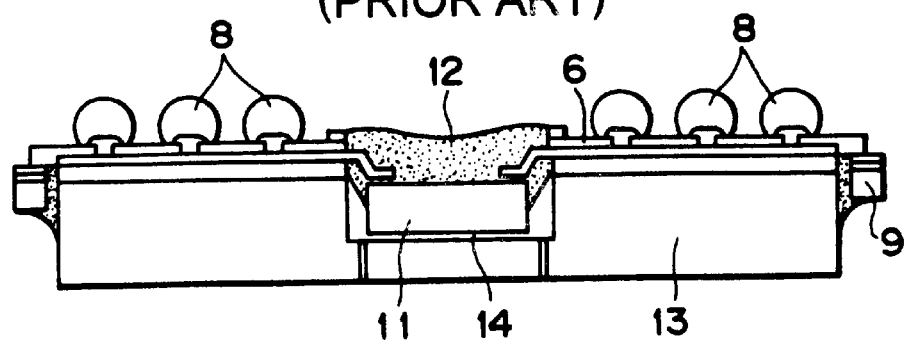
FIG. 12 is a sectional view showing a semiconductor device installed using the lead frame in the conventional type example.

(D) Next, as shown in FIG. 8D, apart every semiconductor device of the lead frame 51 is mutually separated from another part by integrating leads for plural semiconductor devices 41 and cutting a unnecessary part of the lead frame 51. Hereby, a semiconductor device provided with the lead frame 51 as an intermediate circuit base, provided with external terminals 56 in a ball grid array respectively connected to each electrode of the semiconductor device on the intermediate circuit base and reinforced by the outside ring 58 can be obtained. FIG. 9 is a plan showing the semiconductor device formed as a result in a state in which the sealant 59 is removed.

According to this method of manufacturing the lead frame, as the etching stop layer 63 is formed by nickel or a nickel alloy, it can be formed by plating. Therefore, a high-priced vapor deposition device or sputtering device for vapor deposition or sputtering required in a case that aluminum is used for the etching stop layer is not required. Therefore, the cost of facilities can be reduced and as a result, the cost of a lead frame or a semiconductor device using it can be reduced.

As the etching stop layer can be formed by plating, the adhesive strength of the etching stop layer 63 to the metal layer (outside ring) 58 can be enhanced, compared with a case that the etching stop layer is formed by vapor deposition or sputtering. Therefore, deterioration and peeling caused by the invasion of a chemical between the etching stop layer and the adjacent metal layer can be prevented.

In the embodiment shown in FIGS. 4 and 5 and the embodiment shown in FIGS. 7, the etching stop layer composed of nickel or a nickel alloy is formed on the surface of the metal layer as the base material of the lead frame and the underplate layer composed of thin copper is formed on the etching stop layer to more enhance the adhesion of the metal layer composed of copper to be leads to the etching stop layer composed of nickel or a nickel alloy, however, if required adhesion is obtained without forming the underplate layer, the above underplate layer is not necessarily inevitable. If such an underplate layer is not formed, it is not required to be removed when leads are formed by selectively etching the metal layer and an advantage that a lead is never chipped due to the removal is produced.

Figure 13:
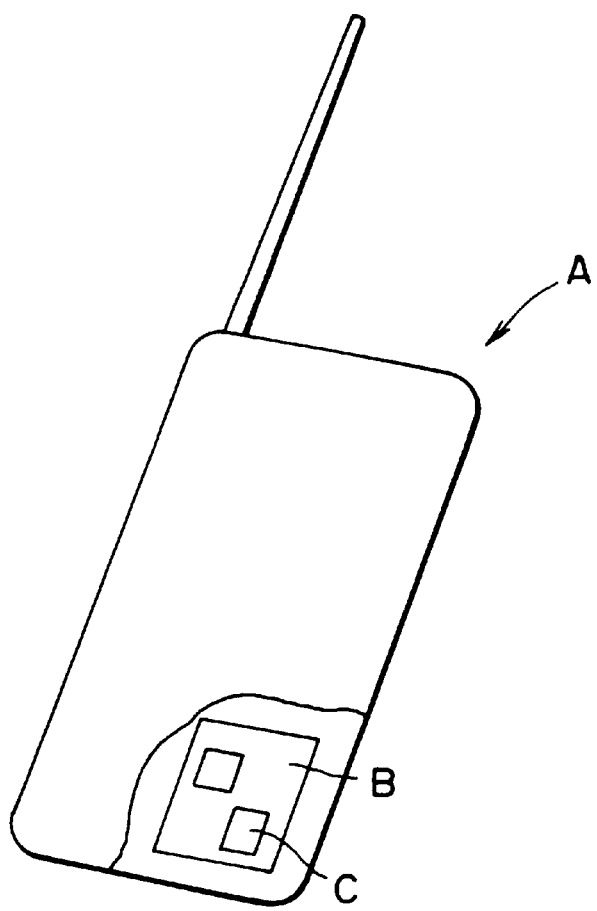
FIG. 13 shows an example of a mobile telephone out of electronic equipment.
Figure 14:
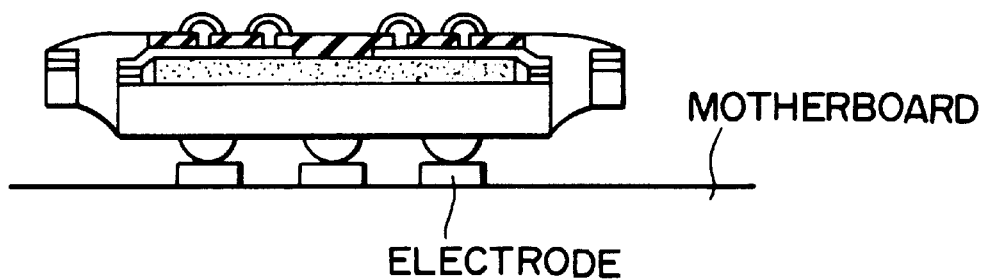
FIG. 14 shows a chip on lead in which a semiconductor device shown in FIG. 8 is reversed.

As the above each semiconductor device can be manufactured at a low price as described above and the reliability is enhanced by electrically connecting an electrode on the circuit board and the external electrode of the above semiconductor device as shown in FIG. 14, it can be used for various electronic equipment, particularly, the above semiconductor device is used for a mobile telephone requiring miniaturization and others and greatly contributes to the miniaturization. FIG. 13 shows an example A of such electronic equipment such as a mobile telephone, the semiconductor device C according to the present invention is mounted on a circuit board B inside the electronic equipment shown as the example and functions at least as a part of the internal circuit of the electronic equipment.

According to the lead frame disclosed in claim 1, as the etching stop layer is formed by nickel or a nickel alloy, it can be formed by plating. Therefore, a high-priced vapor deposition device or sputtering device for vapor deposition or sputtering required in a case that aluminum is used for the etching stop layer is not required. Therefore, the cost of facilities can be reduced and as a result, the cost of a lead frame or a semiconductor device using it can be reduced.

As the etching stop layer can be formed by plating, the bonding strength of the etching stop layer to the adjacent metal layer can be enhanced, compared with a case that the etching stop layer is formed by vapor deposition or sputtering. Therefore, deterioration and peeling caused by the invasion of a chemical between the etching stop layer and the adjacent metal layer can be prevented.

According to the lead frame disclosed in claim 2, as the etching stop layer is formed by nickel or a nickel alloy, it can be formed by plating. Therefore, a high-priced vapor deposition device or sputtering device for vapor deposition or sputtering required in a case that aluminum is used for the etching stop layer is not required. Therefore, the cost of facilities can be reduced and as a result, the cost of a lead frame or a semiconductor device using it can be reduced.

As the etching stop layer can be formed by plating, the bonding strength of the etching stop layer to the adjacent metal layer can be enhanced, compared with a case that the etching stop layer is formed by vapor deposition or sputtering. Therefore, deterioration and peeling caused by the invasion of a chemical between the etching stop layer and the adjacent metal layer can be prevented. Particularly, the change of the outside dimension of a package and the occurrence of a crack on the resin for sealing, bonding and others respectively caused by the invasion of a chemical between the metal layer of the outside ring and the etching stop layer which is caused in a case that the outside ring is provided and peeling as a result can be prevented.

According to the method of manufacturing the lead frame disclosed in claim 3, as the etching stop layer is formed by nickel or an nickel alloy, it can be formed by plating. Therefore, a high-priced vapor deposition device or sputtering device for vapor deposition or sputtering required in a case that aluminum is used for the etching stop layer is not required. Therefore, the cost of facilities can be reduced and as a result, the cost of a lead frame or a semiconductor device using it can be reduced.

As the etching stop layer can be formed by plating, the bonding strength of the etching stop layer to the adjacent metal layer can be enhanced, compared with a case that the etching stop layer is formed by vapor deposition or sputtering. Therefore, deterioration and peeling caused by the invasion of a chemical between the etching stop layer and the adjacent metal layer can be prevented.

According to the semiconductor device disclosed in claim 4, as the etching stop layer of the lead frame used for installing the semiconductor device is formed by nickel or a nickel alloy, the semiconductor device can receive the above advantages with which such a lead frame is provided.

According to the method of manufacturing the semiconductor device disclosed in claim 5, as the semiconductor device is manufactured using the lead frame in which the etching stop layer is formed by nickel or a nickel alloy, the method of manufacturing the semiconductor device can receive the above advantages with which such a lead frame is provided.

What is claimed is:

1. A semiconductor device, wherein:

plural leads are formed on the surface on the side on which a semiconductor device is located of an insulating layer so that the surface of said each lead and the surface of said insulating layer are located on the same plane;

plural openings for respectively exposing said plural leads are formed on the surface reverse to said surface of said insulating layer;

an external electrode is formed at said each opening;

the electrode of said semiconductor device is electrically connected to said plural leads;

an outside ring composed of a thicker metal layer than said lead is provided in the periphery of a part in which said plural leads are formed via a suspending part; and said outside ring is provided with a metal lamination in which a metal layer composed of nickel or a nickel alloy is formed on the side of said suspending part.

2. A semiconductor device according to claim 1, wherein:

said metal layer composed of nickel or a nickel alloy is formed on the other layer of said metal lamination by plating.

* * * * *